United States Patent
Gallatin et al.

(10) Patent No.: US 7,343,271 B2
(45) Date of Patent: Mar. 11, 2008

(54) INCORPORATION OF A PHASE MAP INTO FAST MODEL-BASED OPTICAL PROXIMITY CORRECTION SIMULATION KERNELS TO ACCOUNT FOR NEAR AND MID-RANGE FLARE

(75) Inventors: Gregg M. Gallatin, Newtown, CT (US); Emanuel Gofman, Haifa (IL); Kafai Lai, Poughkeepsie, NY (US); Mark A. Lavin, Katonah, NY (US); Maharaj Mukherjee, Wappingers Falls, NY (US); Dov Ramm, Menashe (IL); Alan E. Rosenbluth, Yorktown Heights, NY (US); Shlomo Shlafman, Haifa (IL)

(73) Assignee: International Business Machines Corporation, Armonk, NY (US)

( * ) Notice: Subject to any disclaimer, the term of this patent is extended or adjusted under 35 U.S.C. 154(b) by 564 days.

(21) Appl. No.: 10/694,465

(22) Filed: Oct. 27, 2003

(65) Prior Publication Data

US 2005/0091013 A1    Apr. 28, 2005

(51) Int. Cl.
G06F 7/60    (2006.01)
G06F 17/50   (2006.01)
G06F 19/00   (2006.01)
G06K 9/00    (2006.01)

(52) U.S. Cl. ............... 703/2; 703/13; 716/2; 716/4; 716/20; 716/21; 700/108; 382/145; 355/67

(58) Field of Classification Search .............. 703/2, 703/13; 700/108; 716/2, 4, 20, 21; 382/145; 355/67

See application file for complete search history.

(56) References Cited

U.S. PATENT DOCUMENTS

| | | | |
|---|---|---|---|
| 5,182,718 A * | 1/1993 | Harafuji et al. ............ 430/30 |
| 5,644,390 A | 7/1997 | Yasuzato |
| 5,647,027 A | 7/1997 | Burges et al. |
| 5,663,893 A * | 9/1997 | Wampler et al. ............ 716/19 |
| 5,680,588 A | 10/1997 | Gortych et al. |
| 5,723,233 A * | 3/1998 | Garza et al. ............ 430/5 |
| 6,078,738 A * | 6/2000 | Garza et al. ............ 716/21 |
| 6,127,071 A | 10/2000 | Lu |
| 6,223,139 B1 * | 4/2001 | Wong et al. ............ 703/5 |

(Continued)

OTHER PUBLICATIONS

Fukuda et al. "Determination of High-Order Lens Aberration Using Phase/Amplitude Linear Algebra", 1999.*

Primary Examiner—Kamini Shah
Assistant Examiner—Shambhavi Patel
(74) Attorney, Agent, or Firm—DeLio & Peterson, LLC; Robert Curcio; Steven Capella

(57) ABSTRACT

A first method to compute a phase map within an optical proximity correction simulation kernel utilizes simulated wavefront information from randomly generated data. A second method uses measured data from optical tools. A phase map is created by analytically embedding a randomly generated two-dimensional array of complex numbers of wavefront information, and performing an inverse Fourier Transform on the resultant array. A filtering function requires the amplitude of each element of the array to be multiplied by a Gaussian function. A power law is then applied to the array. The elements of the array are shuffled, and converted from the phasor form to real/imaginary form. A two-dimensional Fast Fourier Transform is applied. The array is then unshuffled, and converted back to phasor form.

33 Claims, 11 Drawing Sheets

U.S. PATENT DOCUMENTS

| | | |
|---|---|---|
| 6,233,056 B1 | 5/2001 | Naulleau et al. |
| 6,263,299 B1 | 7/2001 | Aleshin et al. |
| 6,289,499 B1 | 9/2001 | Rieger et al. |
| 6,303,253 B1 | 10/2001 | Lu |
| 6,374,396 B1 * | 4/2002 | Baggenstoss et al. ......... 716/19 |
| 6,415,421 B2 | 7/2002 | Anderson et al. |
| 6,425,113 B1 | 7/2002 | Anderson et al. |
| 6,449,387 B1 | 9/2002 | Inui |
| 6,453,457 B1 | 9/2002 | Pierrat et al. |
| 6,460,997 B1 | 10/2002 | Frey et al. |
| 6,487,696 B1 | 11/2002 | Gudmundsson et al. |
| 7,030,997 B2 * | 4/2006 | Neureuther et al. ........ 356/515 |
| 2002/0062206 A1 | 5/2002 | Liebchen |
| 2002/0126267 A1 | 9/2002 | Smith |
| 2002/0159040 A1 | 10/2002 | Hamatani et al. |

* cited by examiner

INCORPORATION OF A PHASE MAP INTO FAST MODEL-BASED OPTICAL PROXIMITY CORRECTION SIMULATION KERNELS TO ACCOUNT FOR NEAR AND MID-RANGE FLARE

CROSS-REFERENCE TO RELATED APPLICATIONS

The present application is related to commonly assigned U.S. patent application Ser. No. 10/694,465, titled "EXTENDING THE RANGE OF LITHOGRAPHIC SIMULATION INTEGRALS", U.S. patent application Ser. No. 10/694,473, titled "IMPROVEMENT OF PERFORMANCE IN SECTOR-BASED OPC ENGINE UTILIZING EFFICIENT POLYGON PINNING METHOD AND SIMULTANEOUS COMPUTATION OF MULTIPLE SAMPLE POINTS", U.S. patent application Ser. No. 10/694,339, titled "RENESTING FLAREMAP INTO DESIGN FOR EFFICIENT LONG-RANGE FLARE CALCULATION", and U.S. patent application Ser. No. 10/694,299, titled "PARALLEL COMPUTATION OF MULTIPLE POINTS ON ONE OR MULTIPLE CUT LINES", filed on even date herewith, which are hereby incorporated by reference herein in their entirety.

BACKGROUND OF THE INVENTION

1. Field of the Invention

This invention relates generally to the field of optical microlithography, and more particularly to the simulation of a wavefront and the incorporation of a phase map to analytically account for flare in optical proximity correction of photolithographic masks.

2. Description of Related Art

The optical microlithography also known as the photolithography process in semiconductor fabrication consists of duplicating desired circuit patterns as best as possible onto a semiconductor wafer. The desired circuit patterns are typically represented as opaque and transparent regions on a template commonly called a photomask. In optical microlithography, patterns on the photomask template are projected onto photoresist-coated wafers by way of optical imaging through an exposure system.

Aerial image simulators, which compute the images generated by optical projection systems, have proven to be a valuable tool to analyze and improve the state-of-the-art in optical lithography for integrated circuit fabrication. These simulations have found application in advanced mask design, such as phase shifting mask (PSM) design, optical proximity correction (OPC), and in the design of projection optics. Modeling aerial images is a crucial component of semiconductor manufacturing. Since present lithographic tools employ partially coherent illumination, such modeling is computationally intensive for all but elementary patterns. The aerial image produced by the mask, i.e., the light intensity in an optical projection system's image plane, is a critically important quantity in microlithography for governing how well a developed photoresist structure replicates a mask design.

Optical proximity correction simulation kernels associated with lithographic processes for semiconductor chip manufacturing currently do not take into account the higher order aberrations, whose results may be realized in long-range effects, although not as prominent in the close-range of 1 to 2 micrometers. As the state of the art moves towards smaller wavelengths of light, such as 193 nm and 157 nm and extreme ultraviolet (EUV) 13 nm; and with device dimensions becoming considerably smaller in ratio to the wavelength of light that is used to print them on the wafer, the long-range effects, such as flare, become significant, making it imperative that higher order aberrations be considered.

In the prior art, data analyses have been hampered by the lack of a flare-capable simulator for handling large areas of a mask. Flare is generally defined as unwanted light in a lithographic process located in places where it should otherwise be dark. The cause of this is threefold. First, wavefront roughness or high order wavefront aberrations, which encompass up to approximately $10^{10}$ Zernikes, cause flare. Optics polishing limitations, contamination, and index variations, such as frozen turbulence inside fused silica, all contribute to wavefront roughness. Second, ghost images or stray reflections, on the order of 1% for a 99% antireflective coating, will also contribute to flare. Last, the scattering from the walls of projection optics may cause flare.

If the flare were constant, a dose shift would compensate for its effects completely. However, it is not constant, and a 1% flare variation may result in an unacceptable Across Chip Line-width Variation (ACLV). ACLV is a key parameter used to describe the fidelity of the printing process. In a design line-width of 45 nm, ACLV of 6 nm represents about +/−15% variation. The acceptable variation is nominally +/−10% or less. This large variation can considerably diminish the circuit performance and in some cases may cause a catastrophic failure. Thus, it is necessary to determine and compensate for the flare's contribution to the ACLV.

Mathematically, flare represents the sum of all halo contributions from the bright regions of the mask; the light surrounding the optical system point spread function (PSF) that is caused by scatter from within the optical system. Thus, flare scales with the bright area. In the short range, which is estimated to be on the order of $R_{min} \sim 5\lambda/(2NA)$ out to 2.5 micrometers (where NA is the numerical aperture of the optical system and $\lambda$ represents the wave length of the light) partial coherent effects are realized. Flare contributions add up incoherently in the medium range (2.5 to 5 micrometers) and in the long range (5 micrometers up to $R_{max} \sim 10$ mm).

Other long-range effects include non-optical effects such as etch, macro loading effects, and chemical flare.

Flare increases with the area of brightness. Thus, bright field masks, where the background is clear or bright, are susceptible to flare in general. Double exposure, where two exposures with two different masks are used to print a single set of shapes, may also cause more of a flare problem. Light effectively leaks from the shield during the second exposure, adding new flare to that already produced in the primary exposure. Masks with varying pattern densities are more susceptible to flare variation. Under certain physical conditions, flare scales as the inverse square of the wavelength, $1/\lambda^2$, and can become more problematic in smaller wavelengths of light including EUV.

Experiments have demonstrated complex flare effects at multiple scales. For example, kernel anisotropy, field variations, and chemical flare have all been shown. Until now, however, data analysis has been hampered by the absence of a flare-capable simulator.

In U.S. Pat. No. 6,263,299 issued to Aleshin, et al., on Jul. 17, 2001, entitled, "GEOMETRIC AERIAL IMAGE SIMULATION," an aerial image produced by a mask having transmissive portions was simulated by dividing the transmissive portions of the mask into primitive elements, obtaining a response for each of the primitive elements, and then simulating the aerial image by combining the responses over all of the primitive elements. However, this analytical approach does not teach or suggest a method to account for the higher order aberrations of flare within an optical proximity correction simulation kernel.

In prior art, the shape of the wavefront is represented by a series whose terms are orthogonal. The most commonly used terms are the Zernike polynomials. To date, higher order aberration effects have not been analytically expressed as polynomials in the art, in contrast to the expression of Zernike polynomials for lower order terms. In the current state of the art Optical Proximity Correction (OPC) tools, the number of Zernike polynomials used is limited up to on the order of 37. Consequently, there exists a need in the art to provide a method of accommodating the higher order aberration effects in subsequent model calibrations.

Accommodating higher order aberrations will ultimately allow for: accuracy in the computation of calibrated optical and resist models; fidelity in the wafer shapes to the "as intended" shapes by achieving better correction of mask shapes; accuracy in simulation of wafer shapes for a better understanding and evaluation of correction methodologies; increases in yield in chip manufacturing due to the better accuracy; and reduced cost in fabrication.

SUMMARY OF THE INVENTION

Bearing in mind the problems and deficiencies of the prior art, it is therefore an object of the present invention to provide a method to account for analytical wavefront construction over the mask at all distances.

It is another object of the present invention to provide a method for creating a phase map from the wavefront.

It is a further object of the present invention to provide wavefront-based kernels for implementation in the short, long, and medium range optical effects.

It is another object of the invention to provide a method of accommodating the higher order aberration effects utilizing existing manufacturer's data for wavefront construction.

It is yet another object of the present invention to provide a method of accommodating the higher order aberration effects utilizing simulated wavefront data.

Still other objects and advantages of the invention will in part be obvious and will in part be apparent from the specification.

The above and other objects, which will be apparent to those skilled in art, are achieved in the present invention, which is directed to a method of performing model-based optical proximity correction comprising: embedding wavefront information on a first two-dimensional complex array having a plurality of array elements and an assigned diameter; generating a phase map from the wavefront information; computing a point spread function from the phase map; and performing optical proximity correction calculations using the point spread function. The step of embedding wavefront information comprises embedding simulated wavefront information from randomly generated data, or embedding empirically derived wavefront data.

The method further comprises: forming the first two-dimensional complex array comprising a plurality of complex numbers having amplitude and phase; obtaining a complex conjugate array corresponding to the first two-dimensional complex array; arranging the first two-dimensional complex array into a symmetric complex array using the complex conjugate array; performing an analytic filtering function on the symmetric complex array; applying a power law function to the symmetric complex array; computing the wavefront by performing a Fourier Transform on the symmetric complex array, resulting in a transformed array; obtaining a circular core of the transformed array of a diameter equal to the first array's assigned diameter, and converting to zero coordinates outside the diameter; and normalizing amplitudes of the transformed array.

The step of forming the first two-dimensional complex array comprises putting the array elements in phasor form with a phase within a range of 2p. The phasor may have an amplitude in the range of 0 to a predetermined small fraction less than 1. The first two-dimensional complex array size can be represented by the log in base two of the first two-dimensional complex array's assigned diameter. The complex numbers are centered within the first two-dimensional complex array, equating each amplitude of the first two-dimensional complex array with a corresponding amplitude of the complex conjugate array, and equating each phase of the first two-dimensional complex array coordinate pair with the inverse of a corresponding phase of the complex conjugate array.

The step of applying a power law function on the symmetric complex array comprises multiplying the amplitude of each of the complex number by the sum of the squares of each of the coordinate pair, the sum raised to a power.

The step of normalizing the transformed array's amplitudes comprises: subtracting an average value of the wavefront from each array element; and replacing each of the elements by an analytical expression, which is a function of both a square root of intrinsic flare and a radius of the wavefront.

The method further includes shuffling the elements such that the element in the first array's center is shifted to the first array's bottom-left corner. This is accomplished by: ignoring a first row and first column of the first array; dividing the first array's remaining portion into four quadrants; exchanging a first quadrant with a second quadrant, and exchanging a third quadrant with a fourth quadrant; exchanging the first and the fourth quadrants; exchanging the second and the third quadrants; converting the elements into real and imaginary form; unshuffling the elements such that the first array is again centered following the Fourier Transform; and converting the first array into phasor form.

The method may also include: exponentiating empirically derived wavefront information resulting in an array of complex numbers in phasor form; embedding the exponentiated wavefront in a larger array having a center such that if a linear dimension of the wavefront array is given by log diameter p, then a corresponding linear dimension of the larger array is given by log diameter q, where q is at least p+3; shuffling the larger array to move the center to a bottom-left quadrant; performing an inverse Fast Fourier Transform on the larger array to obtain a transformed array; unshuffling the transformed array to move the complex numbers from the bottom-left quadrant back to the center; normalizing the magnitude of the unshuffled array; choosing amplitude values of the normalized array and creating a phase map; using the phase map to compute a point spread function array; and scaling the point spread function array from pixel dimension to real dimension.

In a second aspect, the present invention is directed to a method of performing model based optical proximity correction on a lithographic mask pattern incorporating phase maps comprising: incorporating a point spread function array in real dimension within a set of convolution kernels; and computing an aerial image with aberrations using the set of convolution kernels.

In a third aspect, the present invention is directed to a program storage device readable by a machine, tangibly embodying a program of instructions executable by the machine to perform method steps for performing model-based optical proximity correction, the method steps comprising: embedding wavefront information on a first two-dimensional complex array having a plurality of array elements and an assigned diameter; generating a phase map from the wavefront information; computing a point spread function from the phase map; and performing optical proximity correction calculations using the point spread function.

The method further comprises: forming the first two-dimensional complex array comprising a plurality of complex numbers having amplitude and phase; obtaining a complex conjugate array corresponding to the first two-dimensional complex array; arranging the first two-dimensional complex array into a symmetric complex array using the complex conjugate array; performing an analytic filtering function on the symmetric complex array; applying a power law function to the symmetric complex array; computing the wavefront by performing a Fourier Transform on the symmetric complex array, resulting in a transformed array; obtaining a circular core of the transformed array of a diameter equal to the first array's assigned diameter, and converting to zero coordinates outside the diameter; and normalizing amplitudes of the transformed array.

BRIEF DESCRIPTION OF THE DRAWINGS

The features of the invention believed to be novel and the elements characteristic of the invention are set forth with particularity in the appended claims. The figures are for illustration purposes only and are not drawn to scale. The invention itself, however, both as to organization and method of operation, may best be understood by reference to the detailed description which follows taken in conjunction with the accompanying drawings in which:

DESCRIPTION OF THE PREFERRED EMBODIMENT(S)

Figure 11:
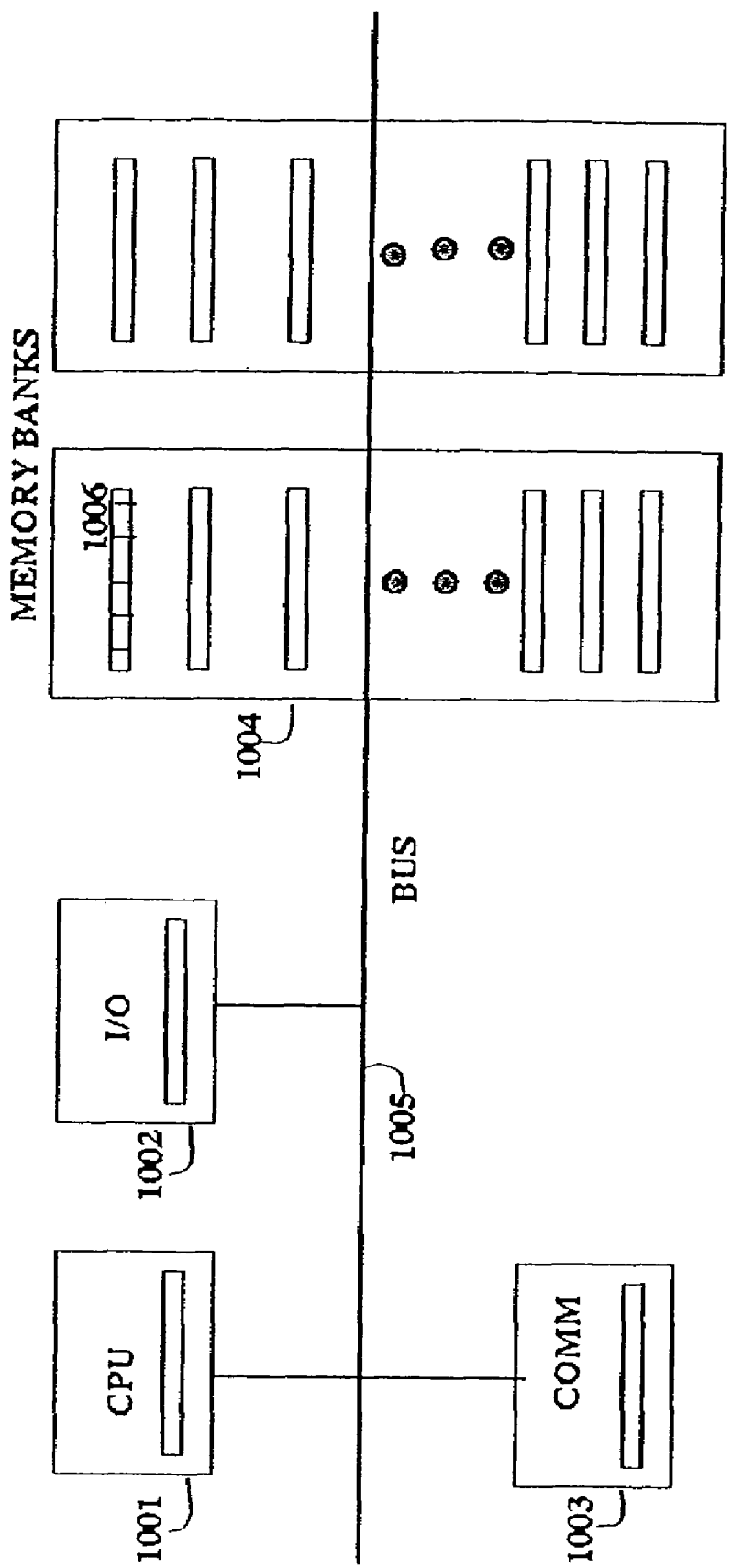
FIG. 11 depicts an example system capable of implementing the present invention.

In describing the preferred embodiment of the present invention, reference will be made herein to FIGS. 11-11 of the drawings in which like numerals refer to like features of the invention.

The present invention provides a method to compute a phase map that can be used to take into account the higher order aberrations within an optical proximity correction simulation kernel, which results in a more accurate computation of OPC when long-range effects become prominent.

Inverse Fourier transforms are used to create a phase map that accounts for higher order aberrations normally ignored in traditional optical proximity correction (OPC) simulation kernels. Two methodologies are proposed to account for the higher order aberrations. The first method utilizes simulated wavefront information from randomly generated data. The second method uses measured or empirically derived data from optical tools.

Figure 1:
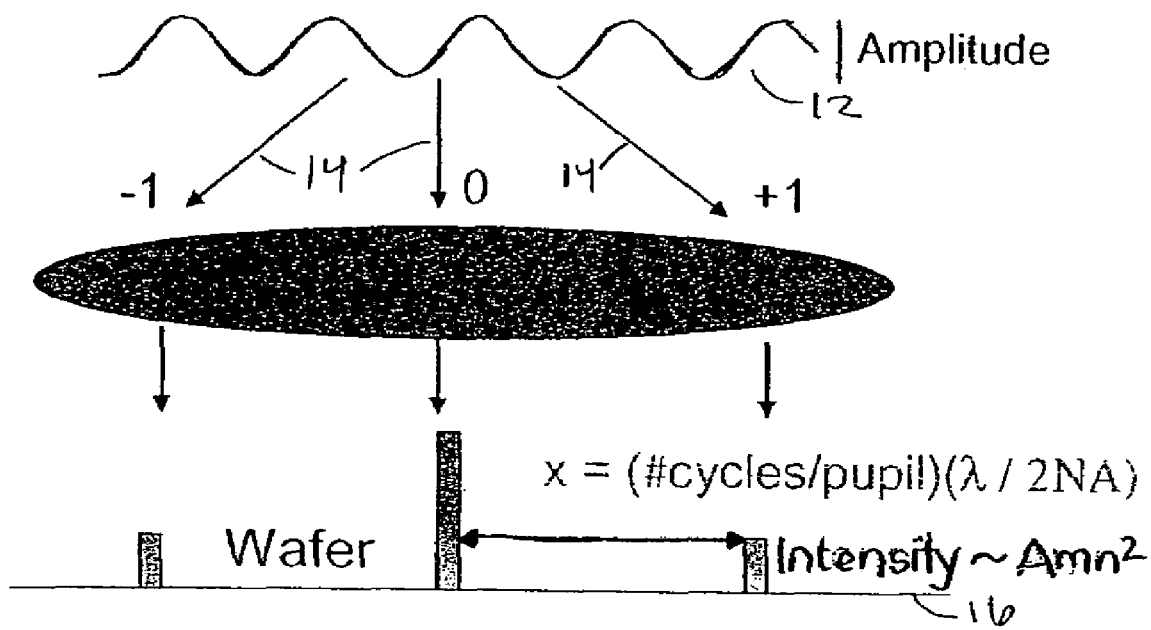
FIG. 1 depicts a wavefront roughness relationship to flare.

In both methods, flare is accounted for. FIG. 1 depicts a wavefront roughness relationship to flare. A single frequency wavefront 12 is shown with zero and first order transmissions 14 on a wafer. The intensity pattern 16 on the wafer is given in square amplitudes and shown as a function of the number of cycles per pupil, the wavelength, and the numerical aperture. Real wavefronts have a continuous distribution of frequencies. The power spectral density (PSD) of the transmitted light can be calculated from the square of the absolute value of the Fast Fourier Transform (FFT) of the wavefront using the following relationships:

$$psd \sim |FFT\ of\ wavefront|^2 \sim Amp^2$$

and $$Amp^2 \sim Power\ Law\ Function \sim 1/(\#cycles/pupil)^\gamma \sim 1/x^\gamma \sim Flare\ Halo$$

where, $$\#cycles/pupil \sim (Zernike\ \#)^{1/2}$$

Polishing and index fluctuations yield γ values of approximately 2. However, the flare halo rapidly exceeds diffraction, creating a diffraction-limited image.

Figure 2:
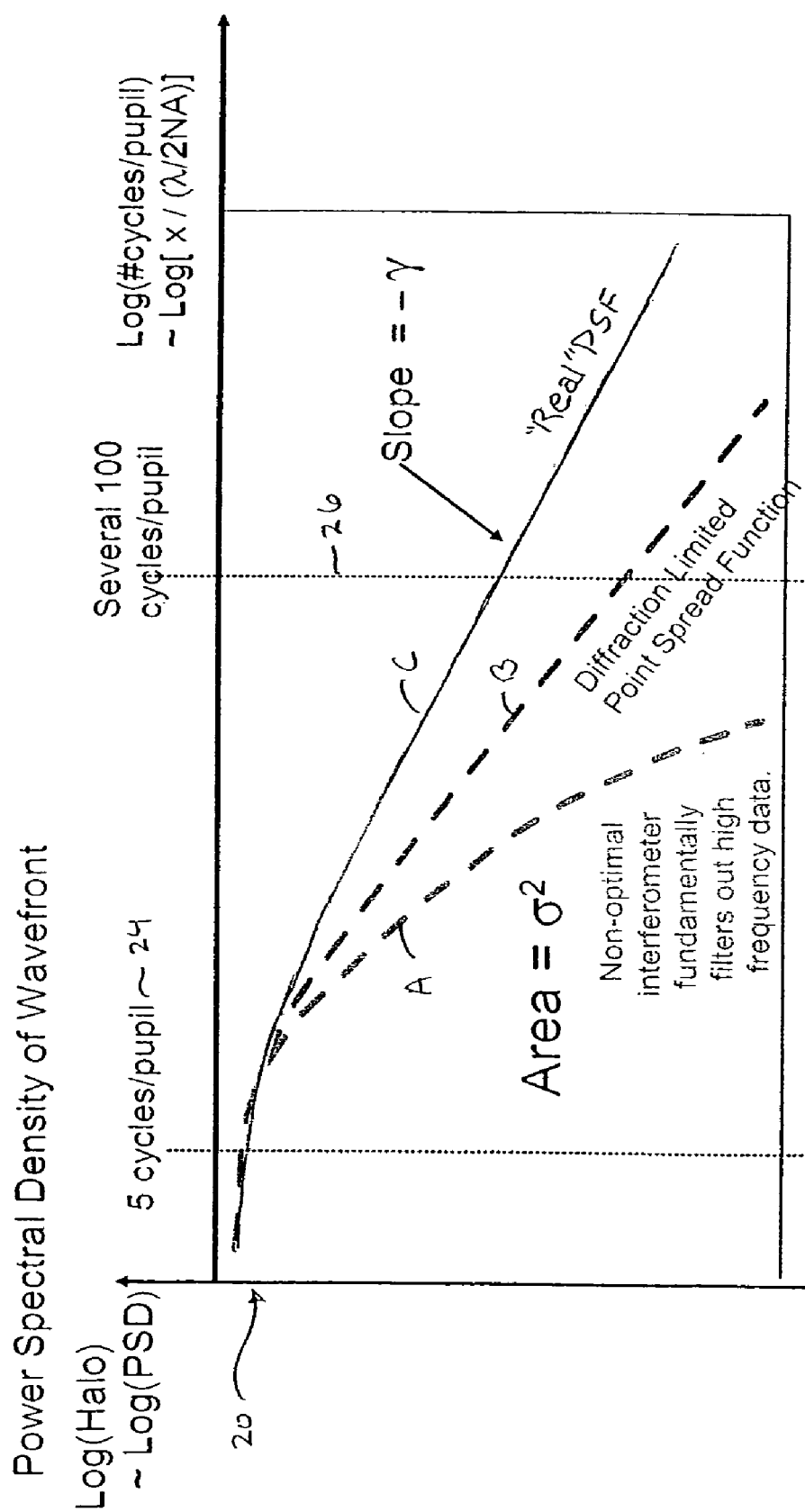
FIG. 2 is a graph of the power spectral density of a wavefront.

The flare is a function of the intrinsic flare and the integral of the power spectral density and mask transmission. When the mask transmission is assumed to be 1, the intrinsic flare value is $(2\pi\sigma)^2$, where σ is the real residual rms wavefront. FIG. 2 is a graph of the power spectral density of a wavefront. This figure also denotes the limitations of the usage of Zernike polynomials and the diffraction limited Point Spread Function (PSF) in simulating flare. The logarithm of the power spectral density (PSD) 20 and also the log of the flare halo are graphed on the ordinate axis as a function of the number of cycles per pupil 24 in case of (PSD), and as the log of the distance scale in case of the log of Halo. The limitation posed by using only on the order of 37 Zernike polynomials is depicted at the x-axis (22). Curve A depicts the area for non-optimal interferometers, which fundamentally filter out high frequency data. Curve B depicts the area for diffraction limited point spread function. This depicts the limitation of the current state of the art OPC tools that use only diffraction limited PSF. Curve C depicts a real point spread function, showing a slope of −γ. Line 26 represents the pixel cut-off for diffraction limited PSF. At this cut-off point, there is enough analytical range to determine γ.

Figure 3:
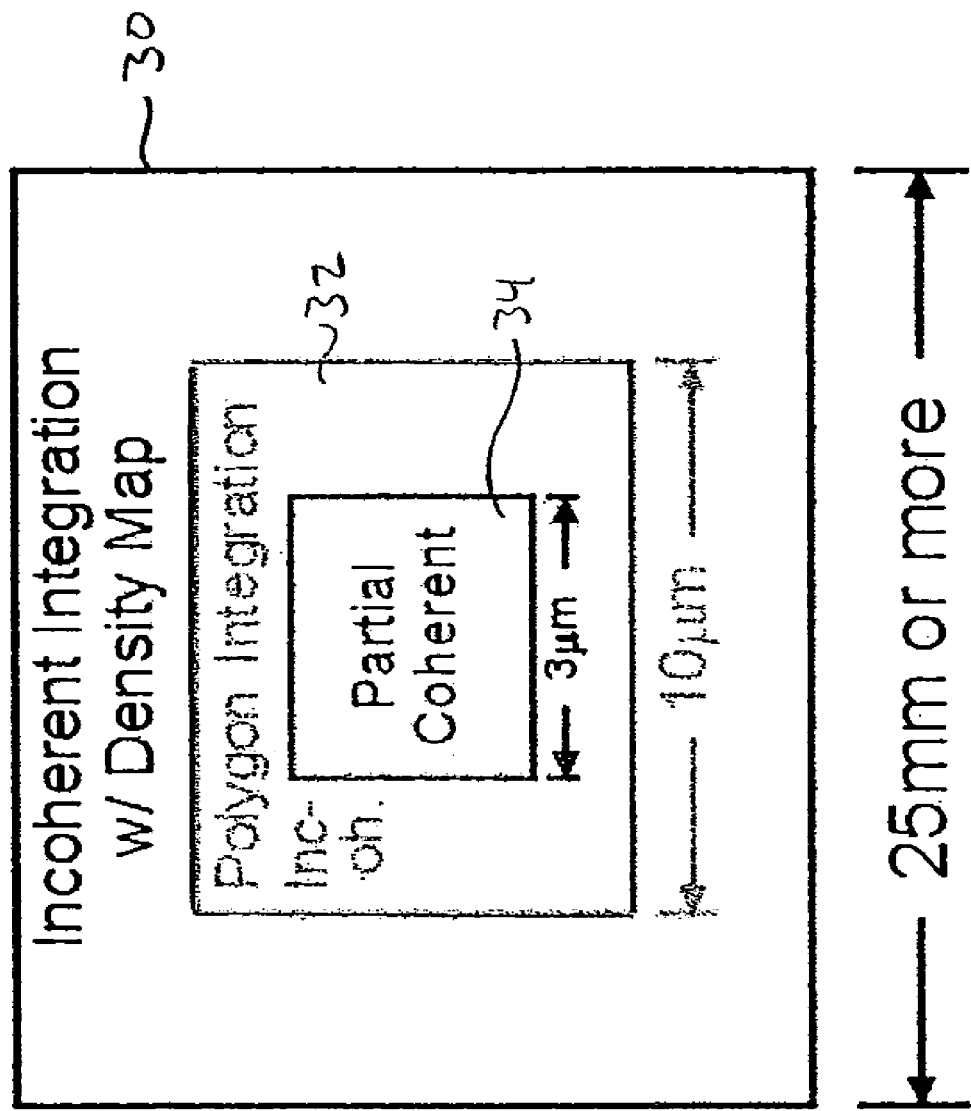
FIG. 3 depicts the segments of the incoherent integration scheme as a function of shape density on the mask.

Flare at any given point is the sum of the contributions from all other points. Under the integration scheme of the present invention, the summation grid may be coarse at certain distant parts of the mask. FIG. 3 depicts the segments of the incoherent integration scheme 30 as a function of shape density on the lithographic mask. This can also be perceived as the intensity density on the wafer. Polygon integration 32 is performed on real estate on the order of 10 square micrometers on the chip, while partial coherent effects 34 are determined at approximately 3 square micrometers. Note that the range is depicted in square for the illustrative purpose only. The ranges may as well be described by circles, or any other closed, and convex geometric shapes. Also the distance scales are described for illustrative purpose only. They may vary within the same range on order, depending on the lithographic process and technology.

In the intermediate range of approximately 1.5 μm to 5 μm (that is within the depicted square of 10 μm), the algorithm of the present invention speeds calculations by integrating directly over the mask polygons. This avoids summation over every pixel when the required pixel-grid is very fine. Additionally, incoherent convolution using an averaged point spread function is accurate for large polygons at an appreciable distance from the image point. However, edges close to each other or to the image point interact coherently. The algorithm of the present invention allows these limitations to be partly relaxed. A coherent integration is used inside the short-range zone of less than approximately 1.5 μm (that is within the depicted square of 3 μm), and an exact, non-average point spread function is utilized in the intermediate range for incoherent light, or alternatively, the average point spread function and analytic solution may be used. Importantly, in order to use and exploit these features, the wavefront/point spread function must be known or the user must employ simulated wavefronts generated to obey user-input statistics.

Figure 4:
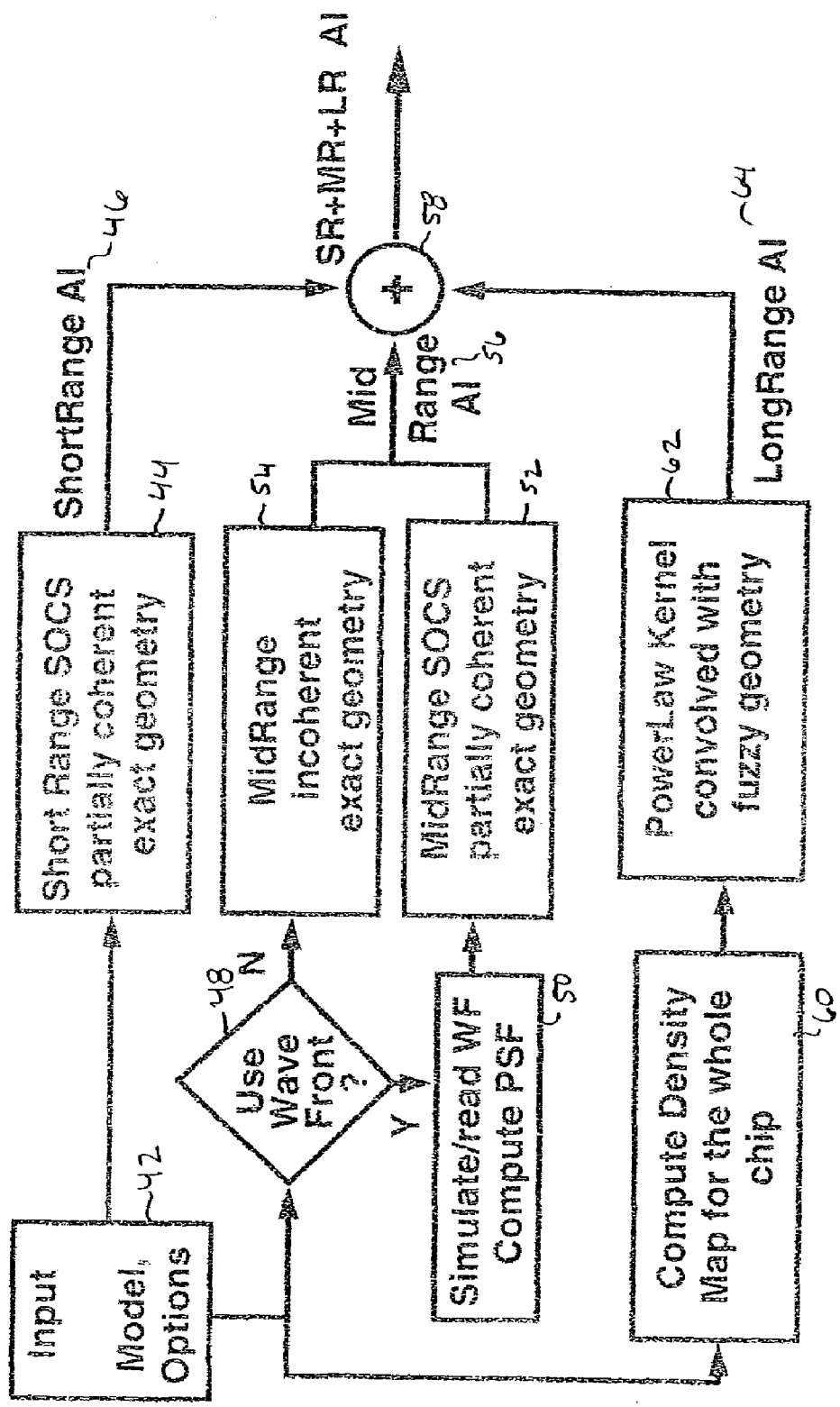
FIG. 4 depicts the overall architecture of an algorithm for implementing the computation of an aerial image at a point that incorporates the wavefront.

FIG. 4 depicts the overall architecture of an algorithm for implementing the computation of an aerial image at a point. First, model options 42 are input by the user. This data is used for short range, partially coherent and exact geometry calculations 44 to obtain the short-range effects of the aerial image 46. It may also be used to determine wavefront data 48. Empirically derived wavefront data or simulated wavefront data is employed and a point spread function computed 50 for the partially coherent, exact geometry, mid-range calculations 52. If no wavefront data is used, the effects of incoherent light may be calculated 54. In either case, the mid-range aerial image is then computed 56 and added to the short-range calculation result 58. Last, the model inputs are used to compute the density map for the entire chip 60. A power law kernel is then convolved with fuzzy geometry 62 to calculate the long-range aerial image 64, which is then added to the short and mid-range calculation results 58.

Figure 5:
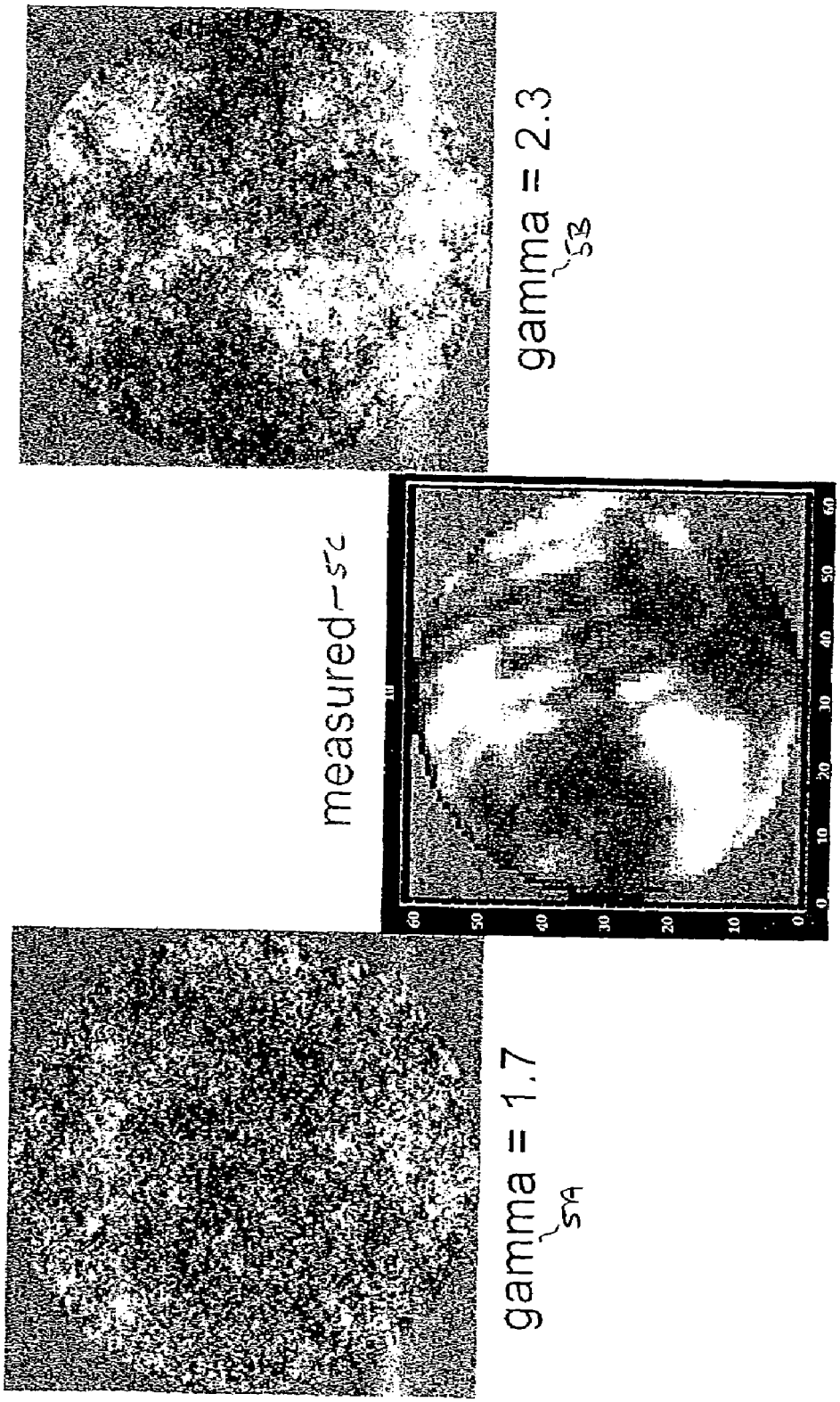
FIGS. 5A-5C compare simulations of the wavefront derived from the power law calculations with real wavefront.

The wavefront technique of the present invention is represented in the overall algorithm of FIG. 4 by the Simulate/read Wavefront and Compute Point Spread Function task 50, and the calculating of the SOCS, partially coherent, exact geometry mid-range effects 52. FIGS. 5A-5C contrast images of the wavefront derived from the power law calculations 5A, 5B to a measured wavefront 5C. The power law estimates are shown for gamma=1.7, FIG. 5A, and gamma=2.3, FIG. 5B. Note that a smaller gamma value denotes more high-frequency terms for the wavefront as shown in FIGS. 5A and 5B.

Figure 6:
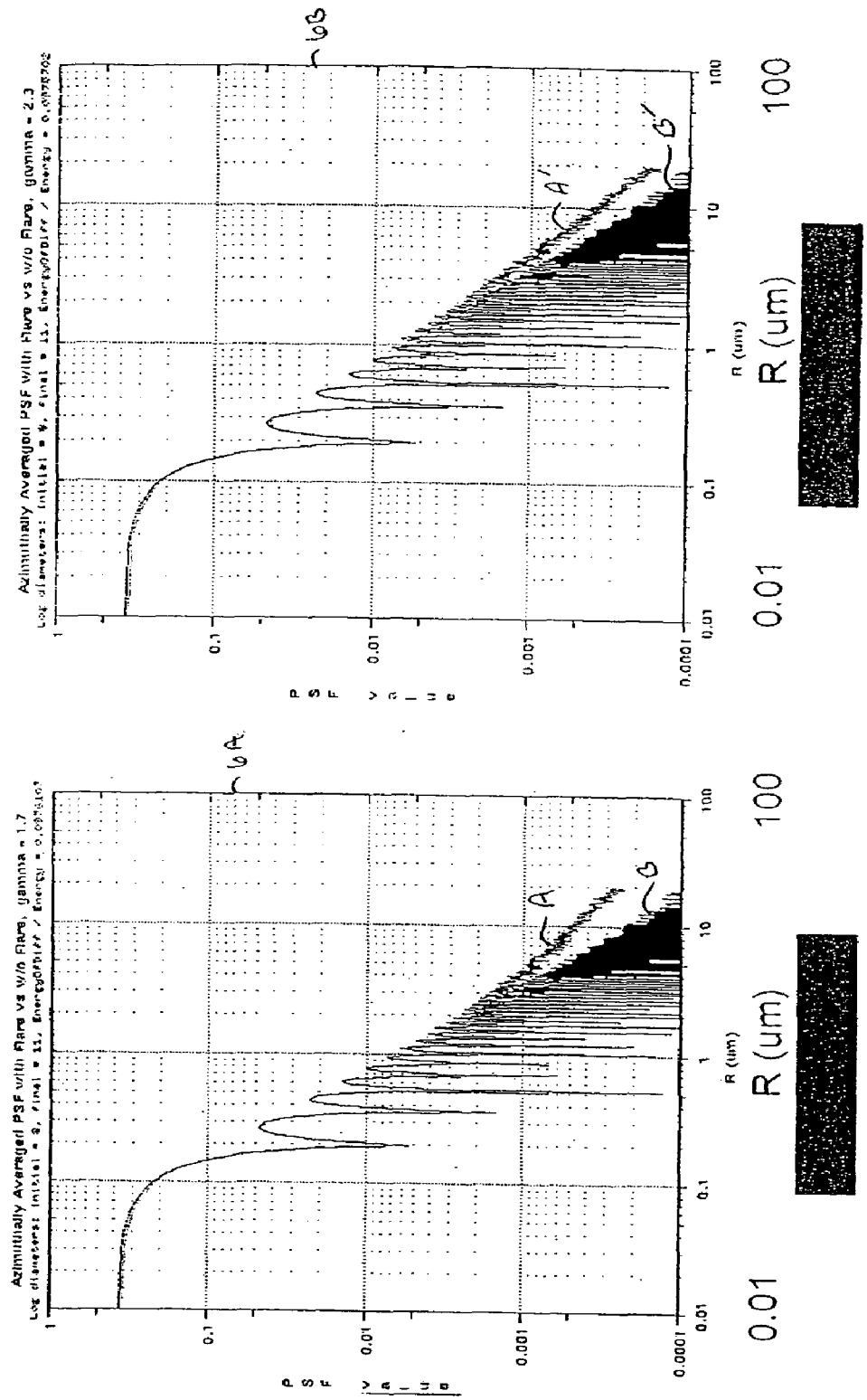
FIGS. 6A and 6B depict the point spread function with flare for the gamma values 1.7 and 2.3, respectively, as a function of range R.

FIGS. 6A and 6B depict the point spread function with flare for the gamma values 1.7 and 2.3, respectively, as a function of range R. Curves A and A' represent a 10% flare, while curves B and B' represent a 0% flare. Note again that a smaller value of gamma shows a wider spread of the PSF denoting a wider effect for the flare. This is shown in FIGS. 6A and 6B.

The simulated wavefront method concentrates only on the high frequency components of the aberrations while ignoring the low frequency components by using an apodizing function such as a super-Gaussian function. This is because the lower order aberration terms are usually included as the Zernike polynomials in the OPC computations. Essentially, the wavefront is filtered by a Super Gaussian function to attenuate the low frequency contributions to the wavefront, while allowing the high frequency contributions to remain intact. Note that the any other attenuating function that effectively filters out the lower order frequency terms can be used instead of the Super Gaussian function. An inverse power law function is applied on the frequency components so that the function emulates the current experimental results of the long-range effects of the optics. The wavefront is generated from this information by applying a Fast Fourier Transform. The resulting wavefront function is then made real by constructing a symmetric complex array A that satisfies the equation $A(x,y)=A^*(-x,-y)$.

A phase map is created from either a simulated wavefront or an empirically derived wavefront by analytically embedding the wavefront on an array having a significant number of guard band zeros, and performing an inverse Fourier transform on the resultant array. Following the inverse Fourier transform, the pixel dimension is then converted to the nominal dimension for implementation with OPC kernels.

The method to generate the phase map is the same whether the wavefront is obtained from simulated data or empirically derived information. Simply described, the methodology comprises either the generation of a simulated wavefront or the embedding of measured wavefront data, and the generation of a point spread function of the wavefront, while retaining the higher order contributions.

Methodology to Generate a Simulated Wavefront

The methodology for creating a simulated wavefront begins with a randomly generated array and ultimately ends with the output of a real wavefront. First, a randomly generated two-dimensional array A of complex numbers is constructed. The elements of array A may be given in phasor form, such that phase and amplitude information is retained. This may also be accomplished by building a complex array of real and imaginary coordinates. The phase is made to vary uniformly in a range of $2\pi$, preferably from $-\pi$ to $+\pi$, and the amplitude made to vary from 0 to a user specified number, which may, for example, be on the order of 0.01.

The elements of array A are arranged such that for any given (x,y) coordinate, the value of array element $A(x,y)$ is equal to the conjugate of the value at the inverse of the coordinates. This may be expressed as the following relation:

$$A(x,y)=A^*(-x,-y),$$

Where $A^*$ is the conjugate of A.

The conjugate array must satisfy an equality relationship for amplitude and an inverse equality relationship for phase:

$$\text{amplitude}(A)=\text{amplitude}(A^*); \text{ and}$$

$$\text{phase}(A)=-\text{phase}(A^*).$$

The (x,y) coordinates are assigned so that they are centered within array A. To achieve this, the numbering of the rows of array A are varied from −y_max to +y_max and numbering of the columns of array A are varied from −x_max to +x_max, leaving the origin at the array center. This numbering is the preferred scheme; however, any other numbering scheme having a similar effect may be used.

To increase the efficiency of the FFT software used, we represent the array size as a number that is something very close to a power of 2. However, to ensure the symmetry of A so that it satisfies the equation $A(x,y)=A^*(-x,-y)$, the number of rows and columns of A needs to be an odd number. Therefore, the number of rows and columns of A is expressed as $2^p+1$, where p is referred as the log-diameter of A. This is because p is equivalent log (#of rows of A−1). Also, the size of A may then be determined by the log of the array's diameter, which is an integer. For example, for an initial input size of 7, the size of A is given as 129×129, where the length 129 is determined from the relation $2^7+1$.

Once the randomly generated two-dimensional array A of complex numbers is constructed, the lower order Zernike terms are filtered out. This is performed so that the terms are not considered twice in the same calculation. The filtering requires the amplitude of each element of A to be multiplied by a Super Gaussian function or other appropriate filtering function. The preferred function is a super Gaussian function, sg(z). The super Gaussian function is determined from the following relationships:

$$f=\lambda/(R\_min \cdot NA),$$

where R_min is the radius of the circular region for the lower order terms;
NA is the numerical aperture; and
$\lambda$ is the wavelength of light;
and $$p=\ln(1-\ln(9)/\ln(10))/(2\ln(1-f))$$

The super Gaussian function sg(z) is then defined from these relationships as:

$$sg(z)=\exp\{-\ln(2)\|(z/f)^p\|\}$$

In order to achieve the necessary filtering, the amplitude of each element of array A(x,y) is replaced by the super Gaussian function acting on the amplitude, such that the resultant amplitude equals $sg(\sqrt{(x^2+y^2)})$.

A power law is then applied to array A by multiplying the resultant amplitude of each element of array A by $\{(x^2+y^2)^{(\gamma/2)}\}$, where $\gamma$ is a user supplied function preferably of a value varying from 1 to 3.

The wavefront is then computed by applying a Fourier transformation to filtered array A. A shuffling mechanism may be applied to the array to enable the array to be used in a commercially available Fast Fourier Transformation tool. This shuffling mechanism transforms the array suitably so that the center of the array moves to the lower left hand corner and all other elements move appropriately. However, this may not be necessary if the Fast Fourier Transform (FFT) method is equipped to handle an array as described above. The shuffling mechanism is described below. First, the elements of array A are shuffled so that the origin of array A (which was at the center of A) is relocated at the bottom-left corner of array A. This is done by the following steps:
 i) ignore the first row and the first column of A;
 ii) divide the elements of A in four quadrants;
 iii) exchange the 1st and the 2nd quadrants;
 iv) exchange the 3rd and the 4th quadrants;
 v) exchange the 1st and the 4th quadrants; and
 vi) exchange the 2nd and the 3rd quadrants.

Note that step (i) causes the number of rows and columns in the array that is passed to the FFT to be a power of 2, if the number of rows and columns of A is initially set at $2^p+1$. The elements of the shuffled array A are then converted from the phasor form to real/imaginary form. This is done because the current commercially available FFT tools handle data in the real/imaginary form. This may not be necessary if the FFT tool can handle the data in the phasor form. A two-dimensional fast Fourier transform is then applied to the array. The array is then unshuffled so that it is again properly centered. Next, it is converted back to phasor form.

After the Fast Fourier Transform (FFT), the phase of the elements of array A will be zero or 2p. This is ensured by the initial assumption that the array coordinates equal the complex conjugate of the inverse coordinates, $A(x,y)=A^*(-x,-y)$.

A circular core of array A is then taken. The diameter of array A is same as the dimension of the original array; however, the rest of the elements are converted to zero. The amplitudes are then normalized in the following manner:
 i) the average value of the amplitude is subtracted from each element;
 ii) amplitude of each element A(x,y) is replaced by the expression:

$$(\sqrt{(\text{Intrinsic Flare})/4\pi})/(\sqrt{(\Sigma(A(x,y)^2)}/\pi \cdot r),$$

where "r" represents the radius of the wavefront.

Figure 7:
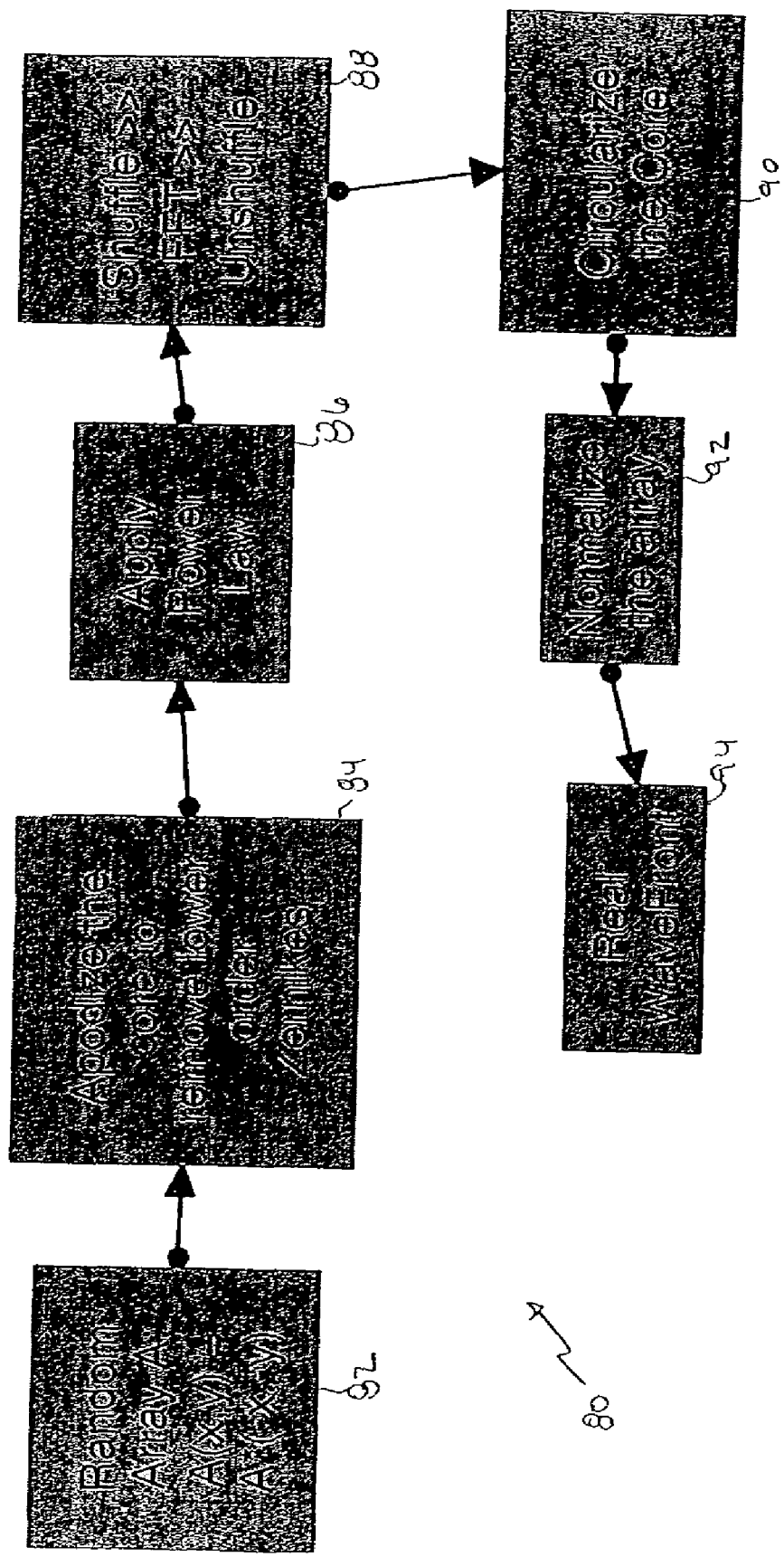
FIG. 7 is a flow chart of the process steps that analytically transform a random array A into real wavefront data.
Figure 8:
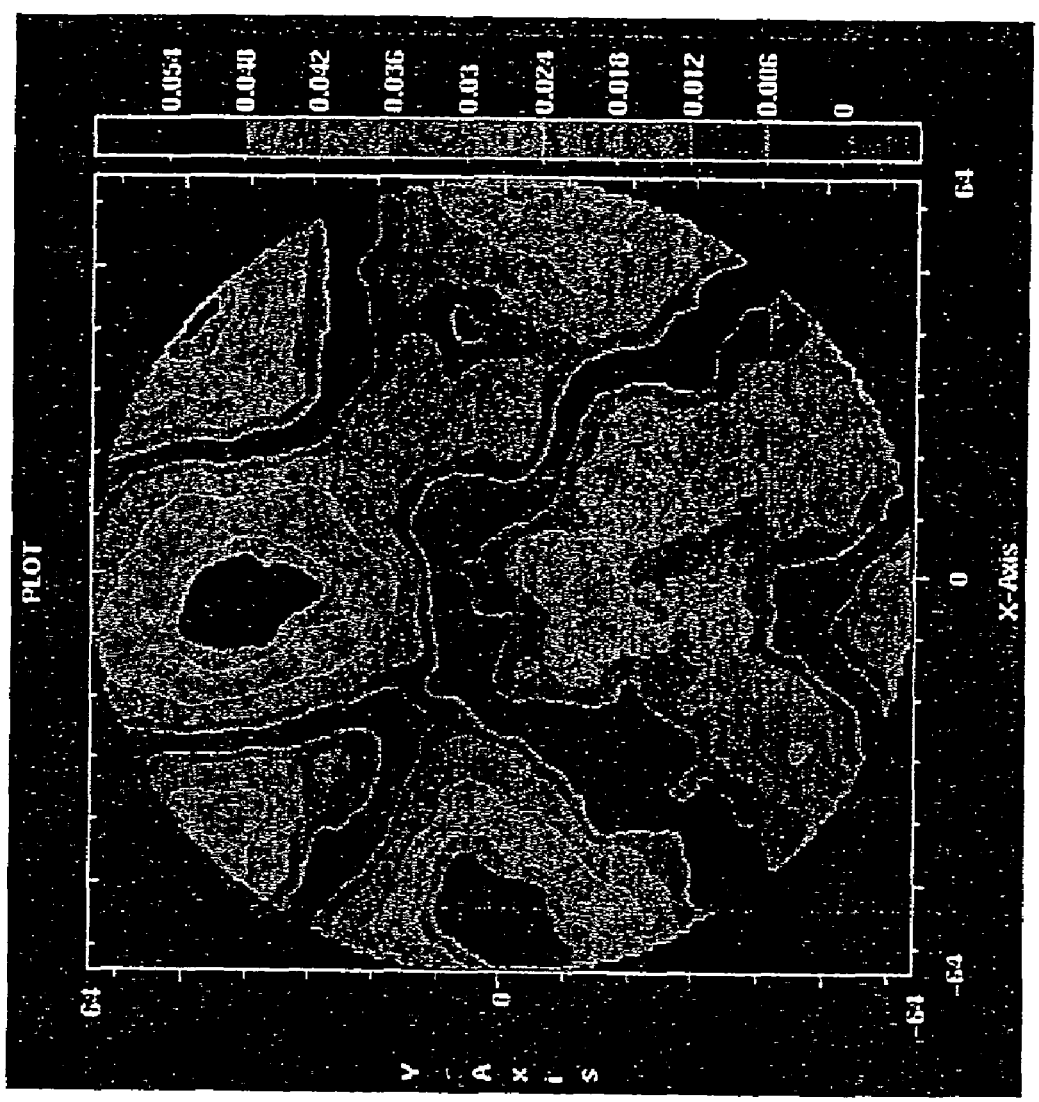
FIG. 8 depicts a resultant simulated wavefront as created by the methodology of the present invention.

The resultant wavefront is real because the phase of all the elements has a value of zero or $2\pi$. FIG. 7 is a flow chart of the process steps 80 that analytically transform a random array A 82 to real wavefront data 94. As previously discussed, the random array A is made to satisfy the condition $A(x,y)=A^*(-x,-y)$, 82. The array core is then apodized to remove the lower order Zernikes 84. A power law function is applied 86. The array is then shuffled, subject to a fast Fourier transform, and unshuffled 88. The core is circularized 90 and normalized 92, resulting in a wavefront represented by real data. FIG. 8 depicts a simulated wavefront as generated by the above-described methodology.

Method for Embedding Measured Wavefront Data

The second methodology proposed to account for the higher order aberrations uses measured or empirically derived data from optical tools. The wavefront data is usually available from tool manufacturers in the form of raw data. This data needs to be properly embedded and centered before it can be used to compute the point spread function. The data provides the following information:
 i) the raw data;
 ii) a description of values that can be analytically ignored; and
 iii) the number of rows and number of columns, which need not be same.

The following steps are employed to embed the data:
 i) reading the data in row major order by substituting a zero for each ignored piece of data;
 ii) centering the data, which is done to avoid unintentional tilt in the data in the following manner, as follows:
  a) locating the best circle that encloses the data;
  b) embedding and centering the circle within a square array, whose dimension is given as the log diameter, p, such that the number of rows and columns of the array is given as $2^{p+1}$.

Figure 9:
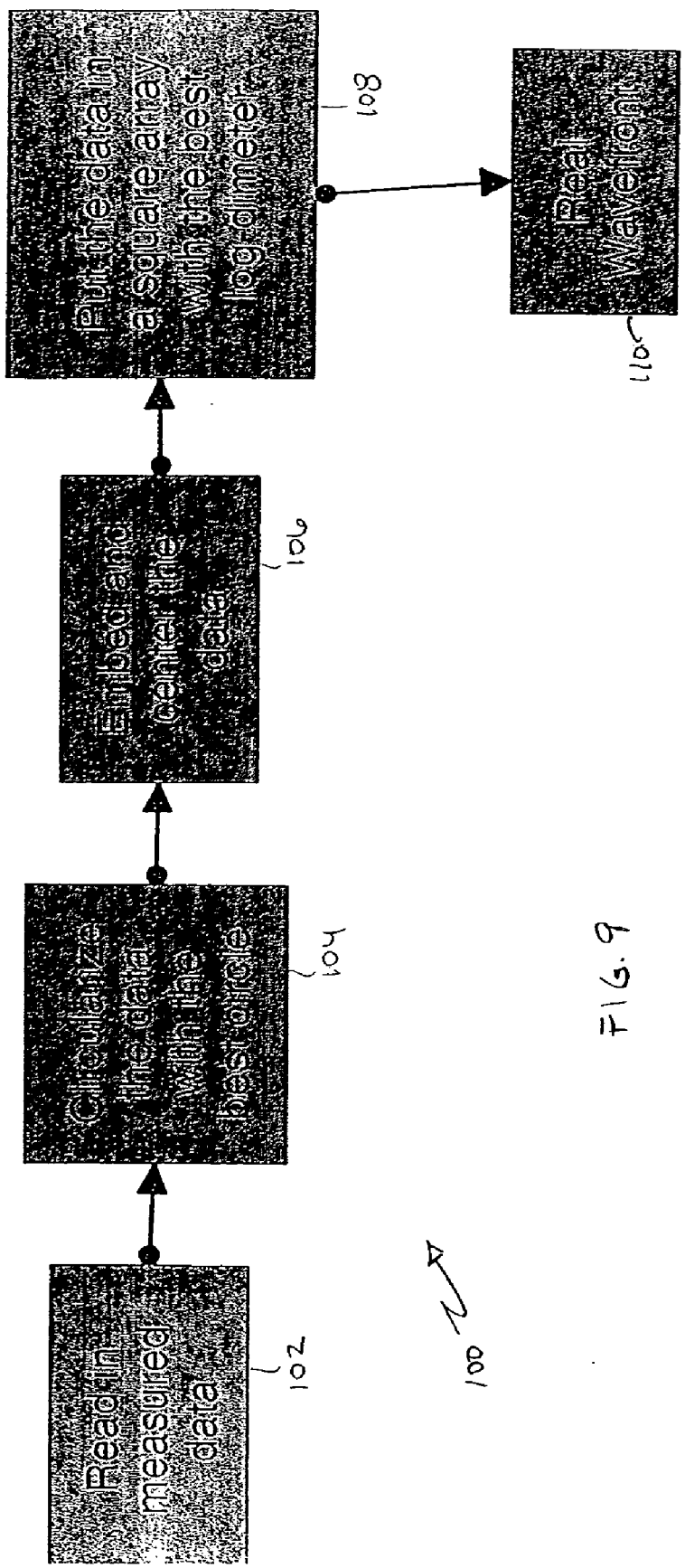
FIG. 9 depicts the process flow for the method of embedding measured or empirically derived data to obtain a real wavefront array.

FIG. 9 depicts the process flow 100 for the method of embedding measured or empirically derived data to obtain a real wavefront array. As shown in the figure, the measured data is inputted 102, circularized with the best fit circle 104, embedded and centered 106, fitted in a square array with the best fit log-diameter 108, and converted to real wavefront data 110.

Figure 10:
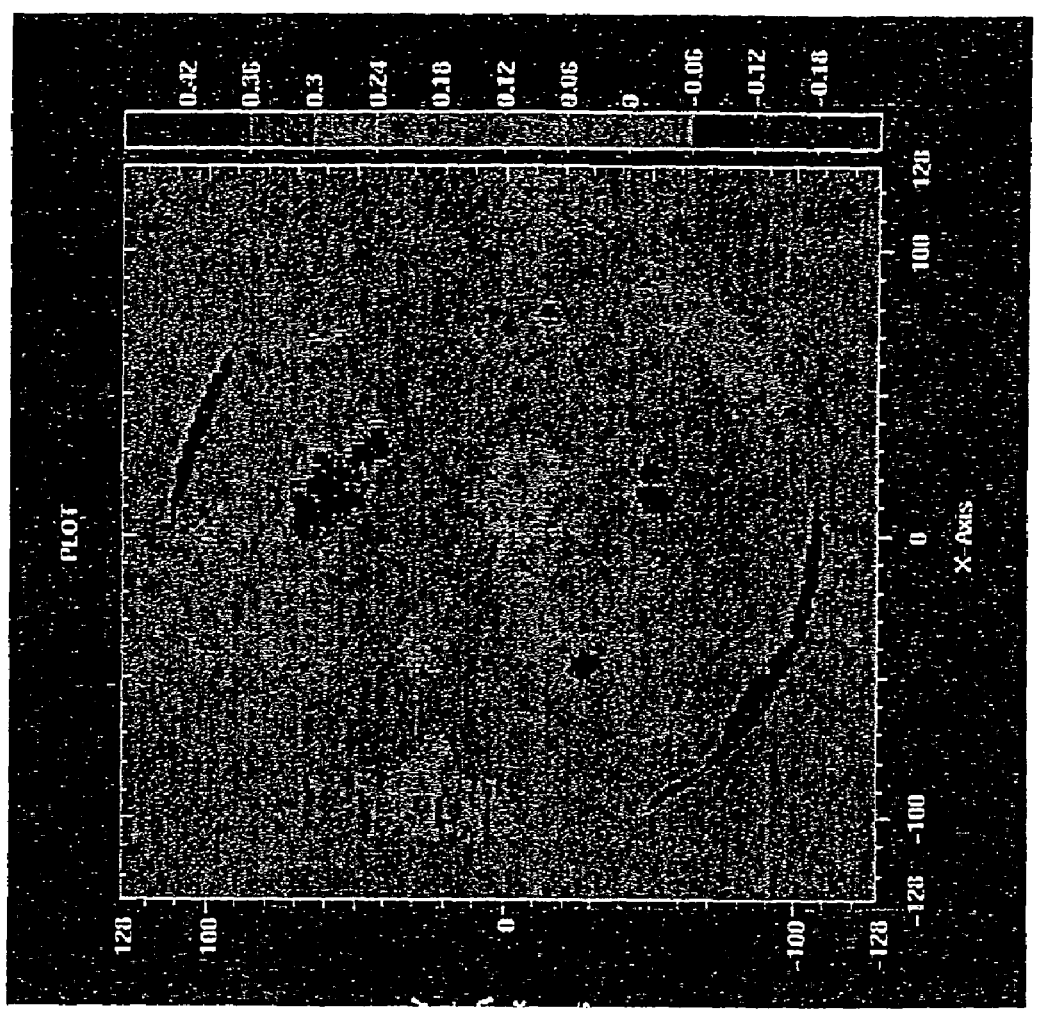
FIG. 10 depicts a picture of a wavefront created from a file of measured or empirically derived data.

A picture of the wavefront created from a file of measured data is shown in FIG. 10.

Methodology to Create a Point Spread Function from Real-Valued Wavefront Data

Whether the wavefront is generated from simulated or empirically derived data, a point spread function is created that will be used to compute the aerial image that accounts for higher order aberrations. First, the real-valued wavefront W is exponentiated as $e^{iW}$. Note that the wavefront created so far is a real array with phase values being zero. Therefore exponentiating this real array has the resulting effect of an array of complex numbers in the phasor form (phase and amplitude), whose phase values correspond to the amplitude values of the wavefront (this follows from the definition of exponentiation), and the amplitude values of all the elements are unity. The wavefront is then embedded in a larger array. As an example, if the dimension of the wavefront array is given by a log-diameter p, then the dimension of the larger array is given by a log-diameter q, where q is preferably at least p+3. Note that for an array, if the dimension is given in terms of a log-diameter p, then the number of rows and columns of the array is given as $2^p+1$.

Next, as before, we prepare the array for an inverse FFT by using a shuffle. This step may not be needed if the FFT tool can handle the data in the given format. The array is shuffled to move the center of the array to the bottom left. An inverse fast Fourier transformation is performed on the shuffled array. The array is then unshuffled to move the bottom-left portion back to the center. The array is scaled from the pixel dimension to the real dimension.

The above-described method computes a phase map that can be used to take into account the higher order aberrations within an optical proximity correction simulation kernel. The method may use either simulated wavefront information or empirically derived information. The wavefront information is modeled within an array, whose elements are reordered, given a complex conjugate correlation, operated upon by a filtering function, and subjected to a fast Fourier transform and later an inverse Fourier transform. The resultant wavefront is calculated to demonstrate the affects of the higher order aberrations.

The method may be implemented through software in a program storage device readable by a machine, tangibly embodying a program of instructions executable by the machine to perform each of the method steps. FIG. 11 depicts an example system capable of implementing the present invention. CPU 1001, I/O device 1002 and communications device 1003 connect via a bus 1005 to a central computer system 1004 having memory banks 1006 to store the program instructions. Other hardware/software combinations are feasible, and can be configured to provide the necessary computing power to perform the present method.

While the present invention has been particularly described, in conjunction with a specific preferred embodiment, it is evident that many alternatives, modifications and variations will be apparent to those skilled in the art in light of the foregoing description. It is therefore contemplated that the appended claims will embrace any such alternatives, modifications and variations as falling within the true scope and spirit of the present invention.

The invention claimed is:

1. A method of generating a corrected phase map by performing model-based optical proximity correction comprising:
   embedding wavefront information on a first two-dimensional complex array having a plurality of array elements and an assigned diameter;
   generating a phase map from said wavefront information;
   computing a point spread function from said phase map;
   performing optical proximity correction calculations that account for higher order aberrations to accommodate flare or spatial frequency of greater than or equal to 2μ using said point spread function; and
   generating a data file containing a transformed array of said corrected phase map having said optical proximity correction.

2. The method of claim 1 wherein said step of embedding wavefront information comprises embedding simulated wavefront information from randomly generated data.

3. The method of claim 1 wherein said step of embedding wavefront information comprises embedding empirically derived wavefront data.

4. The method of claim 2 comprising:
   forming said first two-dimensional complex array comprising a plurality of complex numbers having amplitude and phase;
   obtaining a complex conjugate array corresponding to said first two-dimensional complex array;
   arranging said first two-dimensional complex array into a symmetric complex array using said complex conjugate array;
   performing an analytic filtering function on said symmetric complex array;
   applying a power law function to said symmetric complex array;
   computing said wavefront by performing a Fourier Transform on said symmetric complex array, resulting in a transformed array;
   obtaining a circular core of said transformed array of a diameter equal to said first array's assigned diameter, and convening to zero coordinates outside said diameter; and
   normalizing amplitudes of said transformed array.

5. The method of claim 4 wherein said step of forming said first two-dimensional complex array further comprises putting said array elements in phasor form with a phase within a range of 2p.

6. The method of claim 5 including said phasor having an amplitude in the range of 0 to a predetermined small fraction less than 1.

7. The method of claim 5 wherein said first two-dimensional complex array size is represented by the log in base two of said first two-dimensional complex array's assigned diameter.

8. The method of claim 4 wherein said complex numbers are centered within said first two-dimensional complex array.

9. The method of claim 4 wherein said step of arranging said first two-dimensional complex array into said symmetric complex array further includes equating each amplitude of said first two-dimensional complex array with a corresponding amplitude of said complex conjugate array.

10. The method of claim 4 wherein said step of arranging said first two-dimensional complex array into said symmetric complex array further includes equating each phase of said first two-dimensional complex array coordinate pair with the inverse of a corresponding phase of said complex conjugate array.

11. The method of claim 4 wherein said step of performing an analytic filtering function includes multiplying said amplitude of each of said complex number by an apodizing function.

12. The method of claim 11 further including filtering out low spatial frequency aberrations.

13. The method of claim 4 wherein said step of applying a power law function on said symmetric complex array comprises multiplying said amplitude of each of said complex number by the sum of the squares of each of said coordinate pair, said sum raised to a power.

14. The method of claim 13 wherein said power comprises a supplied user function in the form of g/2 with g in the range of 1 to 3.

15. The method of claim 4 wherein said Fourier Transform is a two-dimensional Fast Fourier Transform.

16. The method of claim 15 including assigning each phase of said complex number to zero after said transform.

17. The method of claim 4 wherein said step of normalizing said transformed array's amplitudes comprises:
subtracting an average value of said wavefront from each array element; and
replacing each of said elements by an analytical expression, which is a function of both a square root of intrinsic flare and a radius of said wavefront.

18. The method of claim 4 including: shuffling said elements such that said element in said first array's center is shifted to said first array's bottom-left corner.

19. The method of claim 18 further including:
ignoring a first row and first column of said first array;
dividing said first array's remaining portion into four quadrants;
exchanging a first quadrant with a second quadrant, and exchanging a third quadrant with a fourth quadrant;
exchanging said first and said fourth quadrants;
exchanging said second and said third quadrants;
converting said elements into real and imaginary form;
unshuffling said elements such that said first array is again centered following said Fourier Transform; and
convening said first array into phasor form.

20. The method of claim 3 further comprising:
reading said empirically derived wavefront data in a row major order by substituting zero for ignored data; and
centering said empirically derived wavefront data.

21. The method of claim 20 further comprising:
obtaining a circle enclosing said empirically derived wavefront data; and
embedding and centering said circle within a square array such that said circle has a diameter represented by an equal number of rows and columns of said array expressed as a value equal to 2 raised to the power of the log of the sum of said diameter plus one.

22. The method of claim 19 further comprising:
exponentiating empirically derived wavefront information resulting in an array of complex numbers in phasor form;
embedding said exponentiated wavefront in a larger array having a center such that if a linear dimension of said wavefront array is given by log diameter p, then a corresponding linear dimension of said larger array is given by log diameter q, where q is at least p+3;
shuffling said larger array to move said center to a bottom-left quadrant;
performing an inverse Fast Fourier Transform on said larger array to obtain a transformed array;
unshuffling said transformed array to move said complex numbers from said bottom-left quadrant back to said center;
normalizing the magnitude of the unshuffled array;
choosing amplitude values of said normalized array and creating a phase map;
using said phase map to compute a point spread function array; and
scaling said point spread function array from pixel dimension to real dimension.

23. The method of claim 22 wherein said array of complex numbers further comprises phase values which are the same as corresponding amplitude values.

24. The method of claim 22 including amplitude values assigned to unity.

25. The method of claim 22 further wherein said large array includes a number of rows and columns calculated by a value equal to 1 added to 2 raised to the p power.

26. A method of generating corrected phase maps for a lithographic mask by performing model based optical proximity correction on said lithographic mask pattern incorporating said phase maps comprising:
incorporating a point spread function array in real dimension within a set of convolution kernels;
computing an aerial image with higher order aberrations to accommodate flare or a spatial frequency of greater than or equal to $2\mu$ using said set of convolution kernels; and
generating a data file containing a transformed array of said corrected phase maps having optical proximity corrections.

27. A program storage device readable by a machine, tangibly embodying a program of instructions executable by the machine to perform method steps for performing model-based optical proximity correction, said method steps comprising:
embedding wavefront information on a first two-dimensional complex array having a plurality of array elements and an assigned diameter;
generating a phase map from said wavefront information, computing a point spread function from said phase map;
performing optical proximity correction calculations that account for higher order aberrations to accommodate flare or a spatial frequency of greater than or equal to $2\mu$ using said point spread function; and
generating a data file containing a transformed array of said corrected phase map having said optical proximity correction.

28. The program storage device of claim 27 wherein said step of embedding wavefront information comprises embedding simulated wavefront information from randomly generated data.

29. The program storage device of claim 27 wherein said step of embedding wavefront information comprises embedding empirically derived wavefront data.

30. The program storage device of claim 28 comprising:
forming said first two-dimensional complex array comprising a plurality of complex numbers having amplitude and phase;
obtaining a complex conjugate array corresponding to said first two-dimensional complex array;
arranging said first two-dimensional complex array into a symmetric complex array using said complex conjugate array;

performing an analytic filtering function on said symmetric complex array;
applying a power law function to said symmetric complex array;
computing said wavefront by performing a Fourier Transform on said symmetric complex array, resulting in a transformed array;
obtaining a circular core of said transformed army of a diameter equal to said first array's assigned diameter, and converting to zero coordinates outside said diameter; and
normalizing amplitudes of said transformed array.

31. A method of performing model-based optical proximity correction on a VLSI layout mask with a lithographic process model having a phase map with higher-order aberrations comprising:
inputting an uncorrected VLSI layout mask;
inputting a lithographic process model;
embedding wavefront information having higher order terms on a first two-dimensional complex array having a plurality of array elements and an assigned diameter;
generating a phase map having higher order terms from said wavefront information;
computing a point spread function from said phase map having higher order terms that accommodate flare or a spatial frequency of greater than or equal to $2\mu$;
incorporating and correcting said phase map with said point spread function within the lithographic process model;
performing optical proximity correction on said uncorrected VLSI layout mask using said lithographic process model having said corrected phase map having higher order aberrations; and
outputting a data file containing a transformed array of a corrected VLSI layout mask.

32. A method of simulating wafer image for a VLSI layout Mask with a lithographic process model having a phase map comprising higher-order aberrations comprising:
inputting a VLSI layout mask;
inputting a lithographic process model;
embedding wavefront information having higher order terms on a first two-dimensional complex array having a plurality of array elements and an assigned diameter;
generating a phase map having higher order terms from said wavefront information to accommodate flare or a spatial frequency of greater than or equal to $2\mu$;
computing a point spread function from said phase map having higher order terms;
incorporating and correcting said phase map within the lithographic process model;
performing simulation on said VLSI layout mask using said lithographic process model having said corrected phase map having higher order aberrations; and
outputting a data file of containing a transformed array including simulated contours from said VLSI layout mask.

33. A program storage device readable by a machine, tangibly embodying a program of instructions executable by the machine to perform method steps for a model-based optical proximity correction on a VLSI layout Mask with a lithographic process model having a phase map with higher-order aberrations comprising:
inputting an uncorrected VLSI layout mask;
inputting a lithographic process model;
embedding wavefront information having higher order aberrations on a first two-dimensional complex array having a plurality of array elements and an assigned diameter;
generating a phase map having higher order aberrations from said wavefront information to accommodate flare or a spatial frequency of greater than or equal to $2\mu$;
computing a point spread function from said phase map having higher order aberrations;
incorporating and correcting said phase map with said point spread function within the lithographic process model;
performing optical proximity correction on said uncorrected VLSI layout mask using said lithographic process model having said corrected phase map having higher order aberrations;
and outputting a data file containing a transformed array of a corrected VLSI layout mask.

* * * * *